(12) United States Patent
Oniki et al.

(10) Patent No.: US 9,761,440 B2
(45) Date of Patent: Sep. 12, 2017

(54) SURFACE PASSIVATION ON INDIUM-BASED MATERIALS

(71) Applicant: Taiwan Semiconductor Manufacturing Company, Ltd., Hsin-Chu (TW)

(72) Inventors: Yusuke Oniki, Hsin-Chu (TW); Andrew Joseph Kelly, Hsin-Chu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 159 days.

(21) Appl. No.: 14/658,012

(22) Filed: Mar. 13, 2015

(65) Prior Publication Data

US 2016/0268122 A1   Sep. 15, 2016

(51) Int. Cl.
| | |
|---|---|
| H01L 21/306 | (2006.01) |
| H01L 21/314 | (2006.01) |
| H01L 23/29 | (2006.01) |
| H01L 21/02 | (2006.01) |
| H01L 23/31 | (2006.01) |
| H01L 29/45 | (2006.01) |
| H01L 29/20 | (2006.01) |
| H01L 29/51 | (2006.01) |
| H01L 29/66 | (2006.01) |
| H01L 29/78 | (2006.01) |

(52) U.S. Cl.
CPC .. *H01L 21/02227* (2013.01); *H01L 21/02175* (2013.01); *H01L 21/02241* (2013.01); *H01L 23/291* (2013.01); *H01L 23/3171* (2013.01); *H01L 29/20* (2013.01); *H01L 29/452* (2013.01); *H01L 29/513* (2013.01); *H01L 29/66522* (2013.01); *H01L 29/78* (2013.01)

(58) Field of Classification Search
CPC ......... H01L 21/02175; H01L 21/02227; H01L 21/02241; H01L 23/3171
See application file for complete search history.

(56) References Cited

U.S. PATENT DOCUMENTS

| | | | |
|---|---|---|---|
| 5,599,748 A * | 2/1997 | Holloway | H01L 21/314 257/E21.266 |
| 6,380,097 B1 * | 4/2002 | Dauplaise | H01L 21/02052 257/E21.228 |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2013/0049132 A1* | 2/2013 | Doris | H01L 21/7682 257/383 |
| 2014/0282326 A1 | 9/2014 | Chen et al. | |

OTHER PUBLICATIONS

Taiwan Office Action issued on Oct. 28, 2016 in Patent Application No. 104138705.

* cited by examiner

*Primary Examiner* — Raj R Gupta (74) *Attorney, Agent, or Firm* — Haynes and Boone, LLP (57) ABSTRACT

The present disclosure provides a semiconductor structure in accordance with some embodiments. The semiconductor structure includes a semiconductor feature, a passivation layer that includes indium sulfide formed over a surface of the semiconductor feature. More particularly, the surface of the semiconductor feature comprises indium-based III-V compound semiconductor material.

20 Claims, 9 Drawing Sheets

SURFACE PASSIVATION ON INDIUM-BASED MATERIALS

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed. For example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been generally adequate, they have not proved entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure is generally directed to a semiconductor device, and more particularly to a semiconductor device having an indium (In)-based material III-V compound semiconductor surface. It is an objective of the present disclosure to provide a method for effectively passivating such an In-based semiconductor surface while providing sufficient process windows and a more compatible fabrication condition for semiconductor device fabrications. The In-based III-V compound semiconductor surface may include materials such as InAs, InP, InSb, InN, $In_xGa_{1-x}As$, $In_xAl_{1-x}As$, $In_xGa_{1-x}N$, $In_xGa_{1-x}P$, and/or $In_xAs_{1-x}Sb_yP_{1-y}$, where "x", "1-x", "y", and "1-y" are the proportions of the corresponding materials. In an example of $In_xGa_{1-x}As$, "x" is the proportion of InAs and "1-x" is the proportion of GaAs. For the purpose of clear illustration, all the proportions (e.g., x, 1-x, y, 1-y) will be omitted after herein. Although the disclosed method is described to be implemented on passivating surfaces of In-based materials, the method may be generalized to be used on other types of semiconductor materials, such as Si, Ge, Si-based semiconductor materials and/or Ge-based semiconductor materials.

Figure 1:
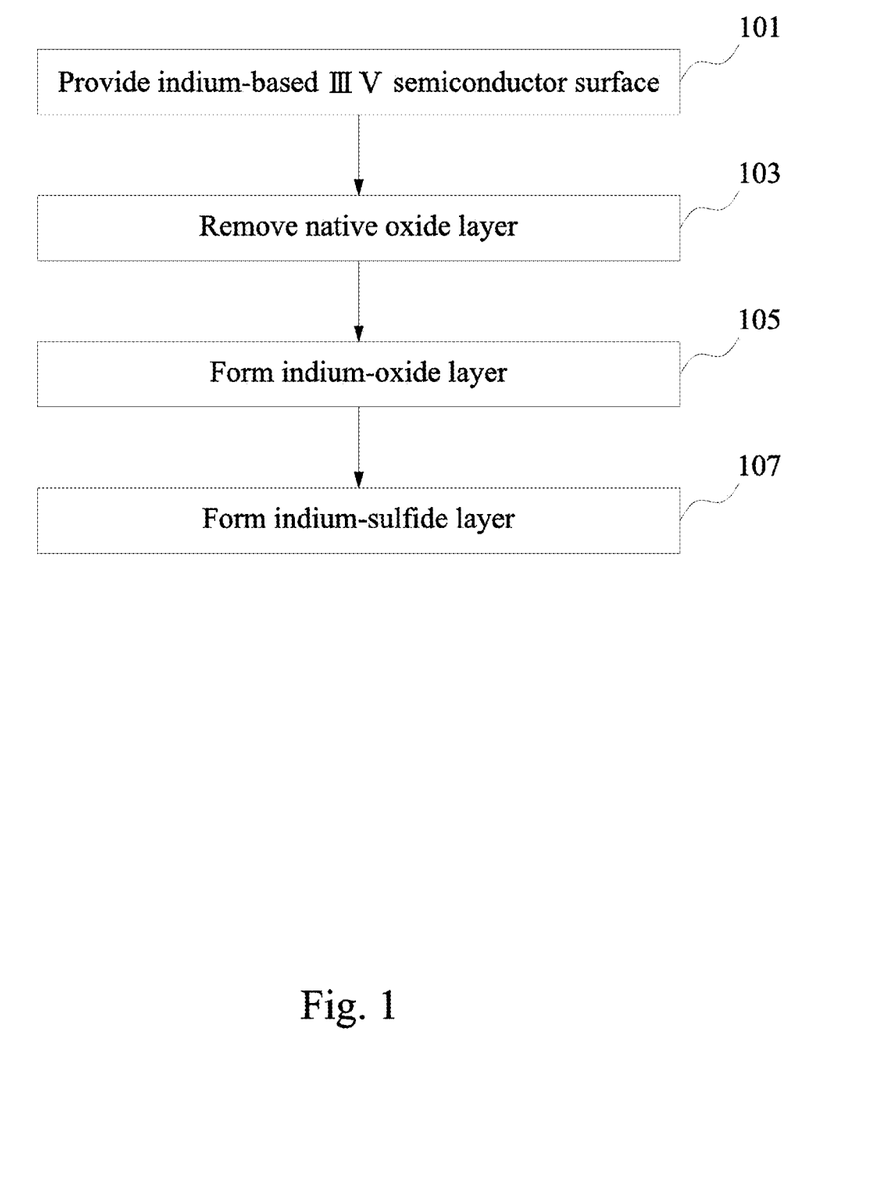
FIG. 1 shows a flow chart to illustrate a method making a semiconductor structure constructed according to various aspects of the present disclosure in accordance with some embodiments.

Referring now to FIG. 1, a flow chart of a method 100 of forming a passivation layer by a sulfurization process on a semiconductor surface in accordance with some illustrative embodiments. The method 100 is merely an example, and is not intended to limit the present disclosure. Additional operations can be provided before, during, and after the method 100, and some operations described can be replaced, eliminated, or moved around for additional embodiments of the method.

The method 100 starts in block 101 with providing a semiconductor surface that includes indium (In)-based III-V compound semiconductor material. As mentioned above, such In-based III-V compound semiconductor materials include InAs, InP, InSb, InN, InGaAs, InAlAs, InAlP, InGaN, InGaP, and/or InAsSbP. The In-based semiconductor surface to be passivated by the disclosed method may be formed by any suitable manner, such as by epitaxial growth or deposition, or provided as an exposed surface of a bulk structure, a semiconductor feature, or material.

In accordance with various embodiments, the method 100 continues in block 103 with removing contaminants, including native oxides, contaminant films, particulate matter, and/or other types of contaminants, which may be formed on the In-based semiconductor surface. Generally, the contaminant, such as a native oxide layer, is removed by using a wet chemical solution, for example, hydrogen chloride (HCl). Such wet chemical solution used to remove contaminants is generally referred to as a pre-clean solution. Additionally or alternatively, the In-based semiconductor surface may be deposited using a UHV (ultra-high vacuum) MBE (molecular beam epitaxy) tool and remains within the tool. Because the semiconductor surface is maintained within a vacuum, in this particular embodiment, the surface may remain relatively uncontaminated. As such, the operation in block 103 may be optional.

After the removal of the contaminants on the In-based semiconductor surface, the method 100 continues in block 105 with forming an indium-oxide layer over the In-based semiconductor surface. In accordance with various embodiments, the formation of the indium-oxide layer is performed via a wet oxidation process. More particularly, the wet oxidation process may include exposing the In-based semiconductor surface to an ammonia-peroxide mixture (APM, or $NH_4OH+H_2O_2$). In an example, by applying APM on an InGaAs surface, an indium-oxide ($In_2O_3$) layer may be formed on the InGaAs surface.

Still referring to block 105, the wet oxidation process may be performed at a temperature level ranging from 25° C. to 60° C. More specifically, in the wet oxidation process, APM may be applied in either a wet dipping process or a spin-coating type of process for a reaction time in a range from 10 seconds to 10 minutes. Still according to some embodiments, a thickness of the indium-oxide layer is based on a reaction time, temperature, and/or a concentration of $NH_4OH$ in APM. For example, with a longer reaction time and higher temperature, a thicker layer of indium-oxide may be formed over the In-based surface.

Continuing in block 107, the method 100 proceeds with forming an indium-sulfide layer over the In-based surface. In some embodiments, the indium-sulfide layer is implemented via applying an aqueous solution of $(NH_4)_2S$ at a concentration between 0.1% by weight and 20% by weight on the formed indium-oxide layer formed in block 105. Such $(NH_4)_2S$ may be applied to the indium-oxide layer to form the indium-sulfide layer on the In-based semiconductor surface in either a wet dipping process or a spin-coating type of process for a reaction time in a range from 10 seconds to 10 minutes and at a temperature level ranging from 25° C. to 80° C. Still in some embodiments, the indium-sulfide layer may be formed via a series of chemical reactions, including ammonium sulfide dissociation, sulfication of indium-oxide layer, etc. Continuing with the above given example of forming the $In_2O_3$ layer on the InGaAs surface, the ammonium sulfide dissociation may include:

At the pH range between 7 and 12 (i.e., pH of 1%-$(NH_4)_2S$ is 9.5), $(NH_4)_2S$ dissociation results in formation of sulfidation specie of $HS^-$, $(NH_4)_2S \rightarrow 2NH_4^+ + S^{2-}$ $S^{2-} + H_2O \rightarrow HS^- + OH^-$, and the sulfidation of indium-oxide layer may include:
It is thermodynamically favorable to replace the OH bonds of $In(OH)_3$ by the $HS^-$, and form indium sulfide layer which is stable in the alkaline solution, $2In(OH)_3 + 6HS^- \rightarrow 2In(HS)_3 + 6OH^-$ $\rightarrow In_2S_3 + 3H_2S + 6OH^-$.

Thus, an indium-sulfide (i.e., $In_2S_3$) layer is formed on the InGaAs surface.

According to an illustrative embodiment, the indium-sulfide layer can be any desired thickness. In order to effectively suppress a formation of native oxidation on the In-based surface, at least three monolayers of indium-sulfide is preferably to be formed on the In-based surface. Generally, the thickness of the indium-sulfide layer may be determined by one or multiple factors, such as an initial thickness of the indium-oxide layer, reaction temperature and time of forming the indium-sulfide layer, concentration of APM, and concentration of the $(NH_4)_2S$.

The formation of the indium-sulfide layer on the In-based surface may be used as a passivation layer. By forming such an indium-sulfide passivation layer on the In-based surface, a formation of native oxide on the In-based surface may be suppressed, and therefore may provide advantages to improve a quality of the In-based surface. More specifically, an improved quality of a surface may be implemented by reducing a density of interface states ($D_{it}$) on the surface of the In-based semiconductor material. Such improvement of the In-based semiconductor surface may advantageously impact an integrated circuit as a whole. For example, an improved surface on a source/drain features may advantageously reduce a contact resistance, and thus may provide an enhancement of a switching speed of an integrated circuit that utilizes such source/drain features.

Figure 2:
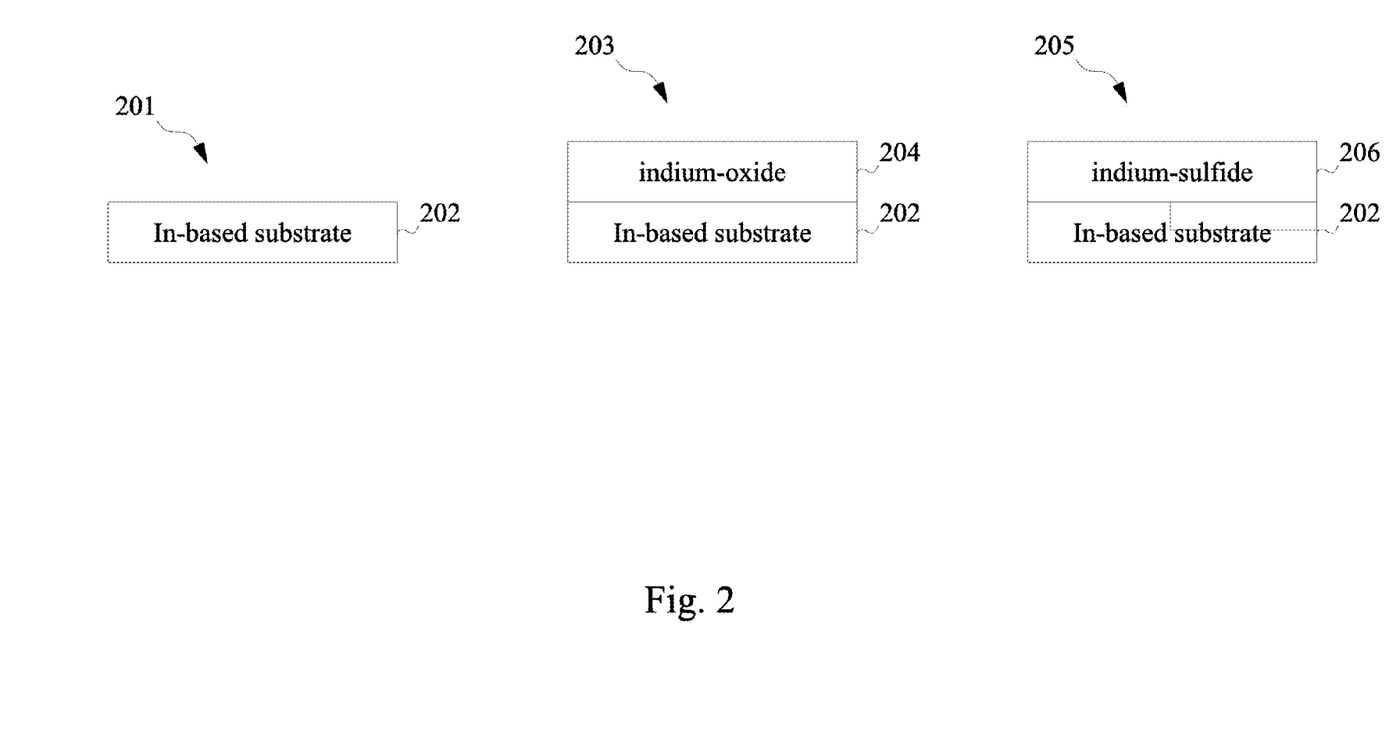
FIG. 2 shows illustrative figures that correspond to the method described in FIG. 1 in accordance with various embodiments.

Referring to FIG. 2, illustrative blocks 201, 203, and 205 are shown to be in conjunction with the method 100 described in FIG. 1. Block 201 corresponds to block 101 in FIG. 1, wherein an In-based III-V semiconductor substrate 202 is provided. Block 203 corresponds to block 105 with forming an indium-oxide layer 204 over the In-based substrate 202. Subsequently, block 205 corresponds to block 107 with forming an indium-sulfide layer 206 over the In-based substrate. In some embodiments, the indium-oxide layer 204 in block 204 may be consumed completely to form the indium-sulfide layer 206. What is to say that the indium-oxide layer 204 may be transformed or sulfurized to the indium-sulfide layer 206 completely. In some alternative embodiments, the indium-oxide layer 204 may be consumed partially via the sulfurization operation, which means that after forming the indium-sulfide layer 206, there may be left indium-oxide layer and newly formed indium-sulfide layer 206 existent over the In-based substrate 202, The method 100 described above is used in forming semiconductor devices 300 and 400 discussed below in FIGS. 3A-3C and 4A-4C. The devices 300 and 400 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), gate-all-around (GAA) FETs, vertical FETs, complementary metal-oxide semiconductor (CMOS) transistors, bipolar transistors, high voltage transistors, high frequency transistors, other memory cells, and/or combinations thereof.

Figure 3A:
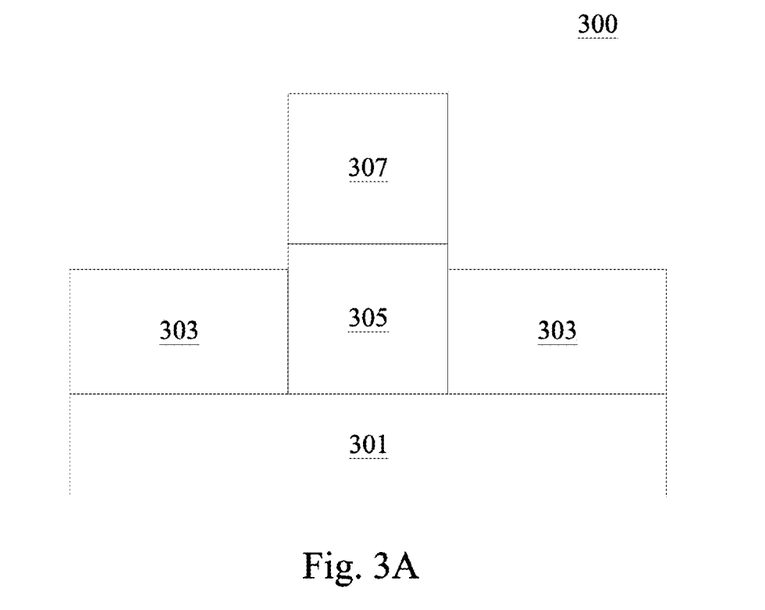
FIGS. 3A-3C shows an example of a semiconductor feature that includes a passivation layer in accordance with some embodiments.
Figure 3B:
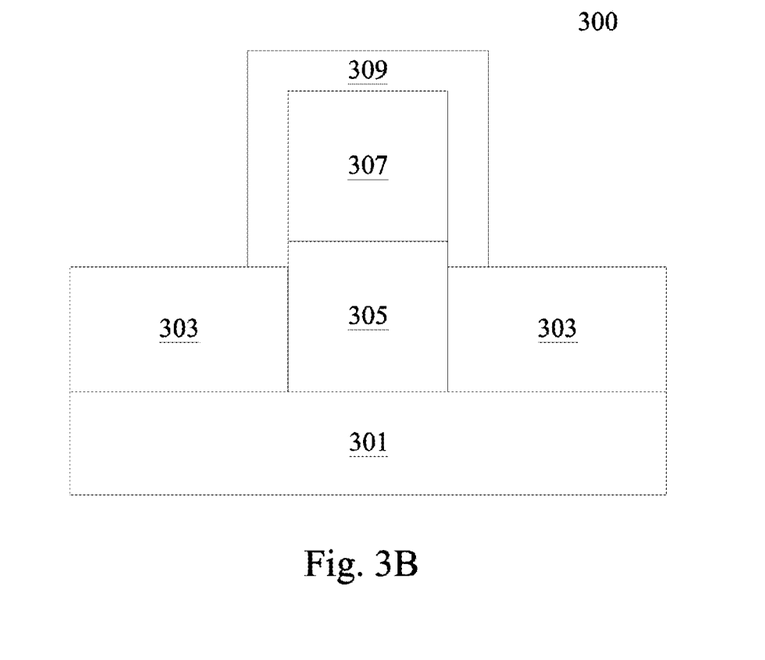
Figure 3C:
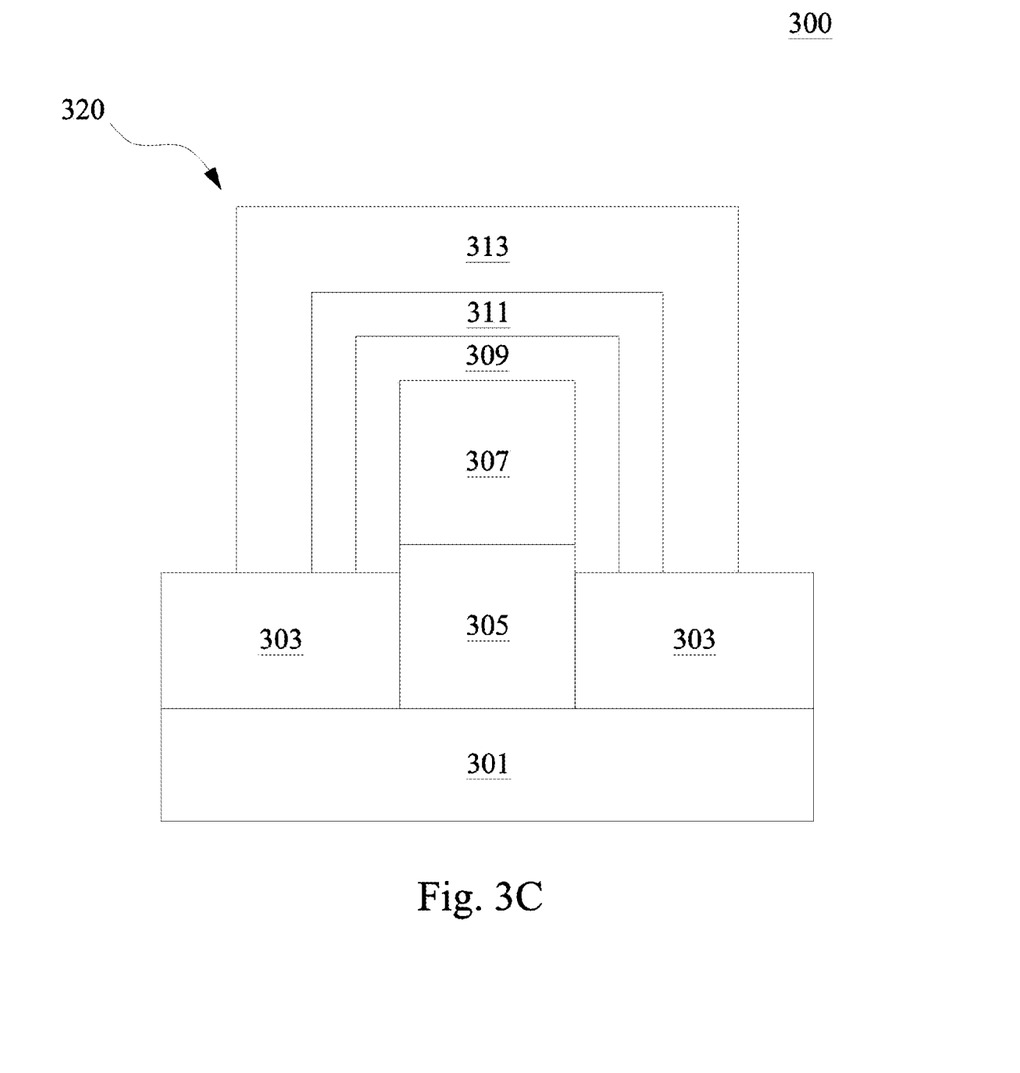

FIGS. 3A-3C show different stages to fabricate an exemplary semiconductor structure 300 that includes an indium-sulfide as a passivation layer in accordance with various embodiments. Semiconductor structure 300 includes a gate stack of a FinFET. In an embodiment, such FinFET includes a fin as a channel region that is formed of indium-based III-V semiconductor material. Semiconductor structure 300 is merely an example to illustrate that the disclosed passivation layer (indium-sulfide layer) can be applied to whatever semiconductor structures, such as planer FET, nanowire FET, vertical FET, GAA FET, etc., that includes an In-based semiconductor surface.

Referring to FIG. 3A, semiconductor structure 300 includes a semiconductor substrate 301, a first semiconductor layer 305 formed of a first semiconductor material, an isolation feature 303, and a fin structure 307 formed of a second semiconductor material. In some embodiments, the semiconductor substrate 201 may be a bulk silicon substrate. Alternatively, the substrate 201 comprises an elementary semiconductor, such as silicon or germanium in a crystalline structure; a compound semiconductor, such as SiGe, SiC, GaAs, GaP, InP, InAs, and/or InSb; or combinations thereof. Alternatively, the substrate 201 includes a silicon-on-insulator (SOI) substrate. The SOI substrate can be fabricated using separation by implantation of oxygen (SIMOX), wafer bonding, and/or other suitable methods. The substrate 201 may include various doped regions and other suitable features.

In some embodiments, the first semiconductor material may be chosen accordingly to match or buffer a lattice mismatch between the second semiconductor material of the fin structure 207 and the substrate 201, wherein the second semiconductor material is In-based semiconductor material. For example, GaAs may be chosen as the first semiconductor material that is formed on the Si substrate 201. The first semiconductor layer 205 and the fin structure 207 may be epitaxially grown or deposited onto the substrate 201 in conjunction with one or more suitable processes, such as a photolithography, an etching process, a chemical polishing (CMP) process, etc.

Referring to FIG. 3B, after the formation of the fin structure 307, passivation layer 309 is formed over the surface of the fin structure 307 by using the method 100 described in FIG. 1. In accordance with various embodiments, although the fin structure 307 is limited to include In-base III-V semiconductor compound materials, the passivation layer 309 may be formed over a surface of other types of semiconductor materials, such as Si, Ge, SiGe, and/or non-In-based III-V semiconductor materials. Subsequently, referring to FIG. 3C, a gate dielectric layer 311 and a gate contact 313 may be formed over the passivation layer 309 so as to form a gate stack 320.

As mentioned above, by forming an indium-sulfide passivation layer (e.g., 309) on a surface of an In-based semiconductor surface (e.g., 307), an advantageous impact may be provided for a semiconductor structure as a whole. In the examples of FIGS. 3A-3C, improving the surface quality of the fin before depositing the gate dielectric layer may cause an enhancement of gate coupling (i.e., controllability of the gate over the channel), and thus in turn may provide a more well-defined threshold voltage, a higher conductive current, and/or a lower leakage current of the semiconductor structure 300.

Figure 4A:
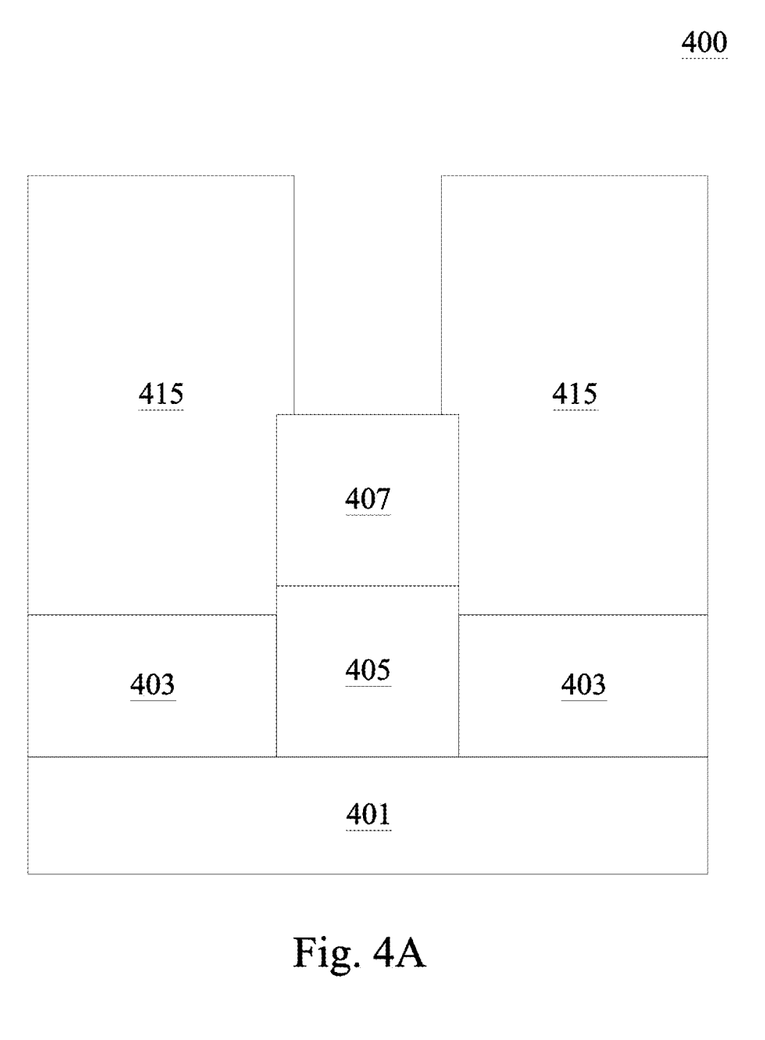
FIGS. 4A-4C show another example of a semiconductor feature that includes a passivation layer in accordance with some embodiments.
Figure 4B:
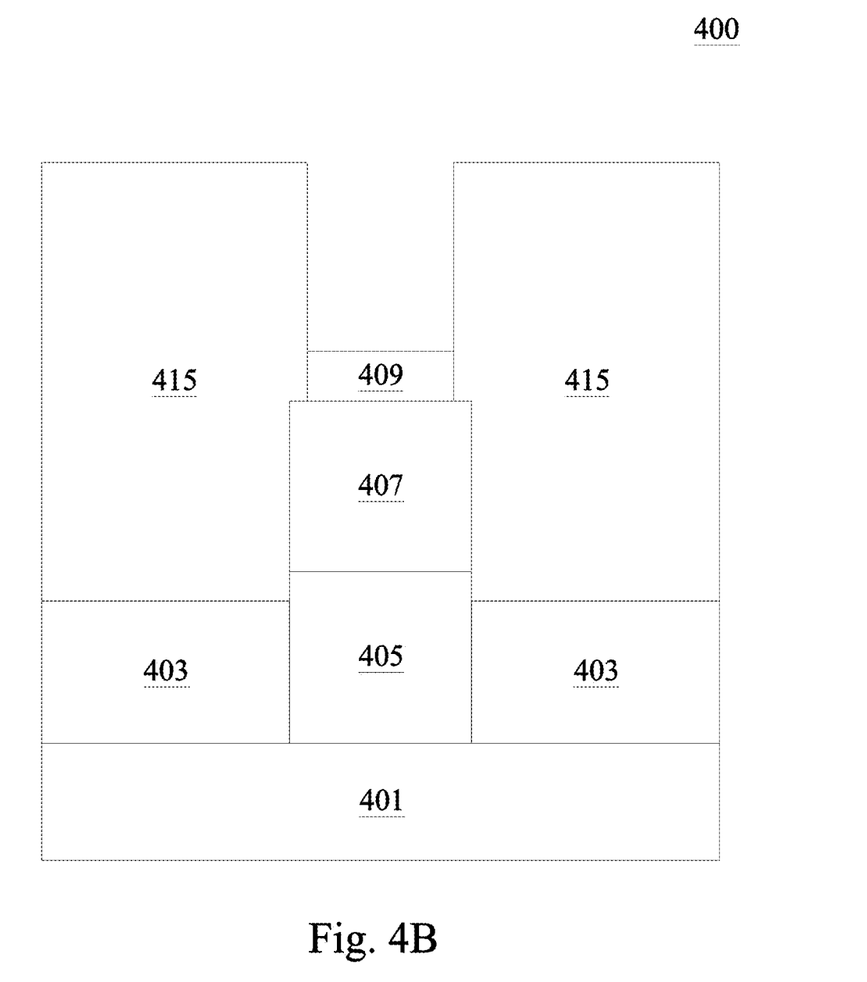
Figure 4C:
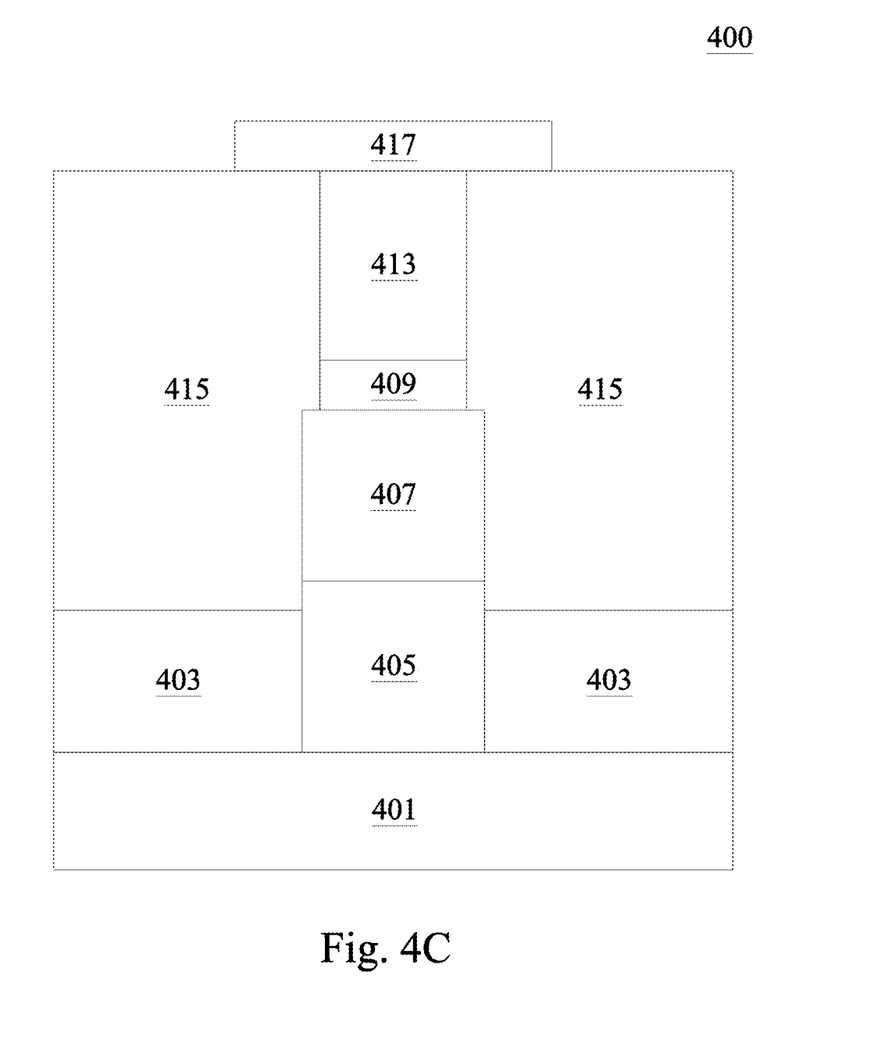

FIGS. 4A-4C show different stages to fabricate another exemplary semiconductor structure 400 that includes an indium-sulfide as a passivation layer to improve a source/drain contact of the semiconductor structure 400 (i.e., a FinFET) in accordance with various embodiments. Referring to FIG. 4A, semiconductor structure 400 includes a semiconductor substrate 401, a first semiconductor layer 405 formed of a first semiconductor material, an isolation feature 403, a fin structure 407 formed of a second semiconductor material, and a dielectric layer 415. In some embodiments, the semiconductor substrate 401 may be a bulk silicon substrate. Alternatively, the substrate 401 comprises an elementary semiconductor, such as silicon or germanium in a crystalline structure; a compound semiconductor, such as SiGe, SiC, GaAs, GaP, InP, InAs, and/or InSb; or combinations thereof. Alternatively, the substrate 401 includes a silicon-on-insulator (SOI) substrate. The SOI substrate can be fabricated using separation by implantation of oxygen (SIMOX), wafer bonding, and/or other suitable methods. The substrate 401 may include various doped regions and other suitable features.

Similar to the semiconductor structure 300, the first semiconductor layer 405 may serve as a buffer layer. The second semiconductor layer 407 may be part of the fin structure 307 with respect to FIG. 3. Additionally, the second semiconductor layer 407 may be n- or p-type doped so as to form a source/drain feature of the semiconductor structure 400. For example, the first semiconductor layer 405 may be formed of GaAs, and the second semiconductor layer 407 may be formed of heavily n-type doped InAs, InGaAs, or any In-based semiconductor material.

Referring to FIG. 4B, by using method 100 described in FIG. 1, a passivation layer 409 is formed over the surface of the In-based layer 407 so as to improve the surface quality of the In-based layer 407. Subsequently, referring to FIG. 4C, in accordance with various embodiments, a conductive layer 413 formed of Ti/TiN may be deposited onto the passivation layer 409 and a metal contact 417 over the Ti/TiN layer 413, thereby forming a metal-insulator-semiconductor (MIS) contact at the source/drain feature of the semiconductor structure 400.

Figure 5A:
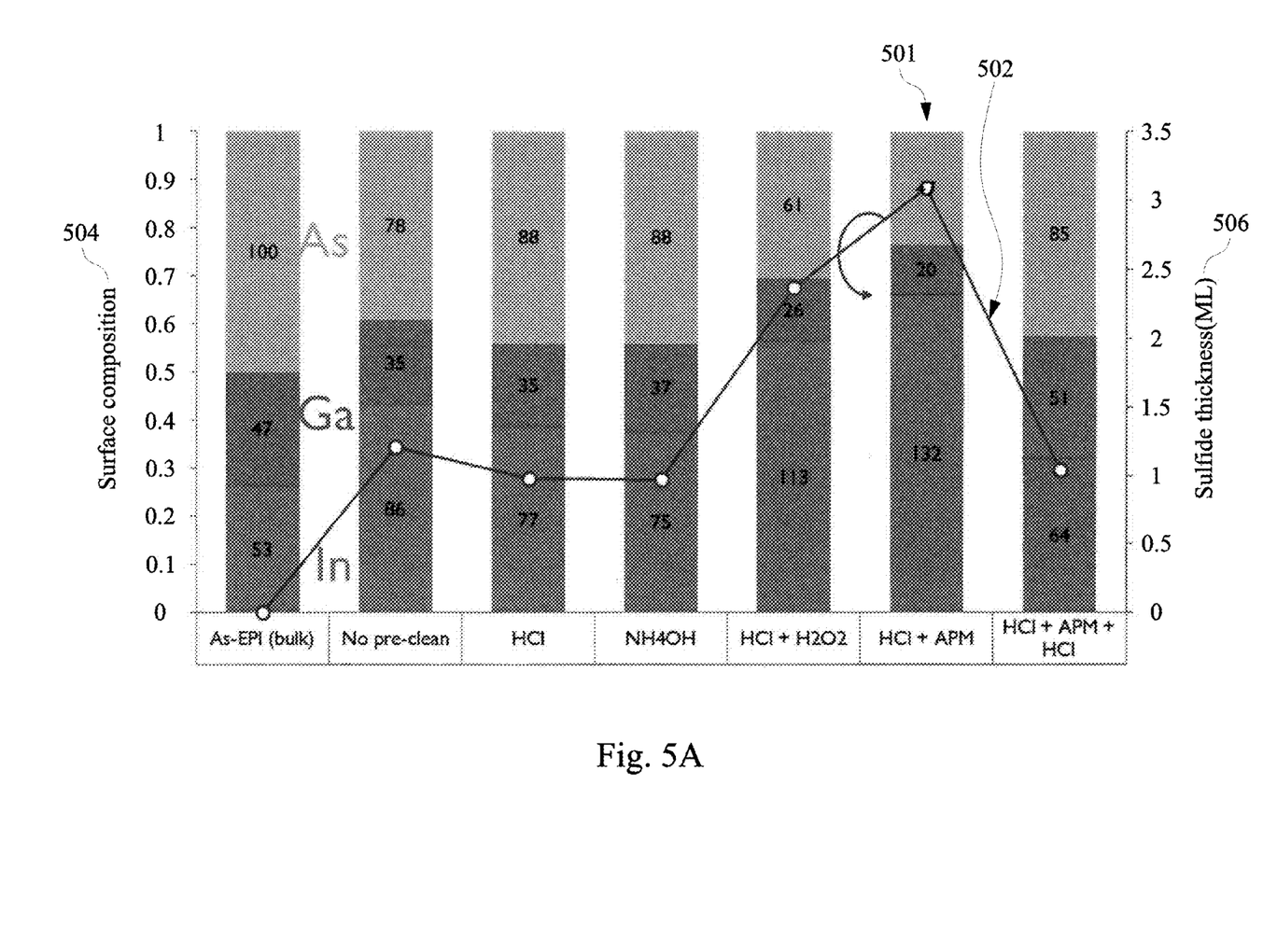
FIGS. 5A and 5B shows an effect of different pre-clean solutions and/or different wet oxidation solutions on a formed indium-sulfide layer and a passivated In-based semiconductor surface in accordance with some embodiments.

FIG. 5A shows an effect of different pre-clean solutions and/or different wet oxidation solutions on propositions of In, Ga, and As. Further, FIG. 5A compares a relation between different combination of pre-clean and/or wet oxidation solutions and a thickness of a formed indium-sulfide layer. More specifically, as shown in FIG. 5A, the chart includes seven bars (e.g., 501), wherein each bar corresponds to one combination of pre-clean and/or wet oxidation solutions before the process of forming an indium-sulfide passivation layer (i.e., 107 in FIG. 1). Each bar further includes three numbers as shown. In an embodiment, the number corresponds to a proportion of each material on the surface of an InGaAs semiconductor surface. FIG. 5A further includes a plot 502 that illustrates the relation between different combination of pre-clean and/or wet oxidation solutions and a thickness of a formed indium-sulfide layer. For example, as shown in bar 501 of FIG. 5A, before the sulfication process (i.e., 107), the InGaAs semiconductor surface is treated by HCl to remove contaminants (i.e., 103) and by APM to form an indium-oxide layer (i.e., 105) respectively. After forming an indium-sulfide layer (i.e., 107), bar 501 shows a respective proportion of In, Ga and As as 47, 20 and 132. Also, the thickness of the indium-sulfide layer is measured at around three monolayers (as read from the right axis of FIG. 5A).

Figure 5B:
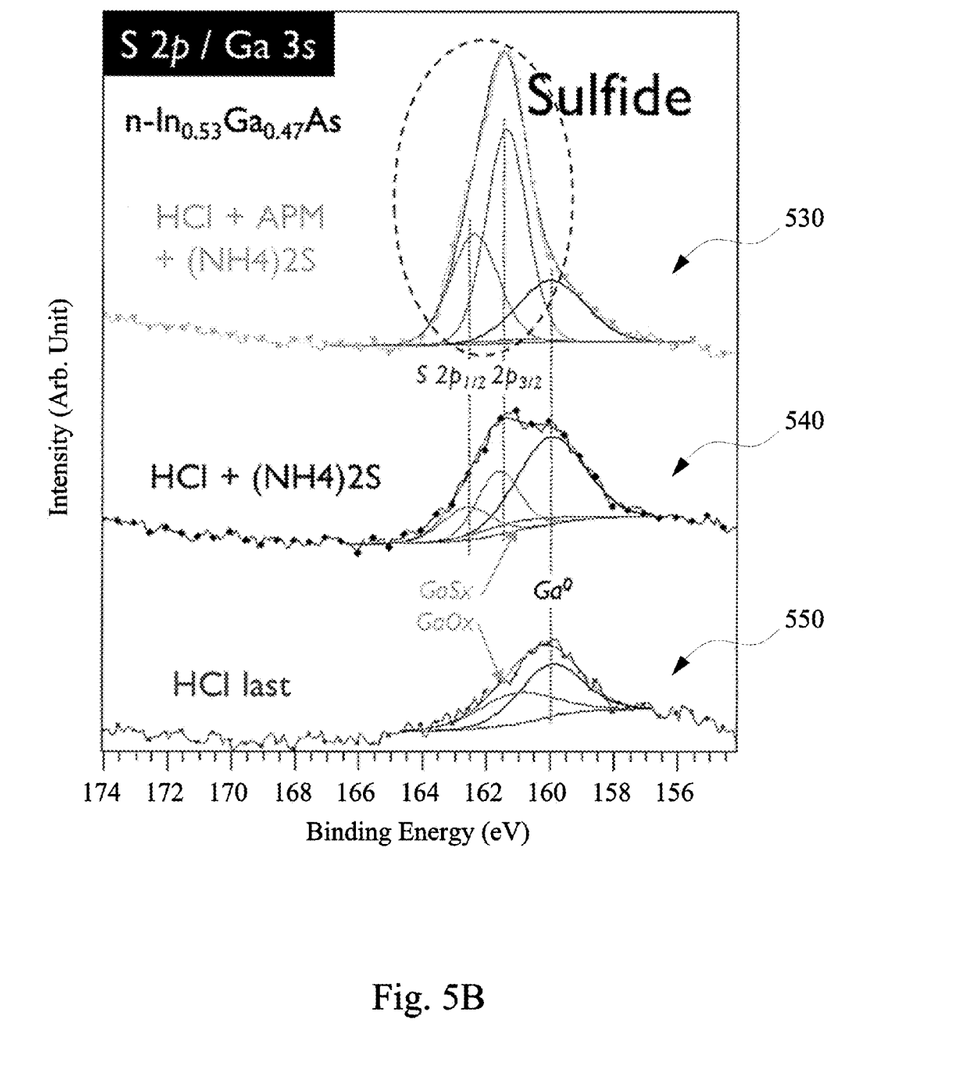

FIG. 5B shows X-ray photoelectron spectroscopy (XPS) spectra of three formed indium-sulfide layers that are treated by three different combinations of pre-clean and/or wet oxidation solutions on the surface of InGaAs semiconductor. As shown in FIG. 5B, 530 corresponds to a treatment that includes processes of removing contaminants 103, forming indium-oxide layer 105, and forming indium-sulfide layer 107; 540 includes processes of removing contaminants 103 and forming indium-sulfide layer 107; 550 includes process of removing contaminants 103. In accordance with various embodiments, by implementing the disclosed method, that is 530, to passivate the surface of InGaAs material, a strongest intensity of sulfide is detected as shown in FIG. 5B compared to treatments 540 and 550.

The present disclosure provides a method and structure of a FET that provide an improved surface (e.g., less $D_{it}$) of an In-based semiconductor surface. The In-based semiconductor surface may be implemented in any suitable semiconductor features, including an interface of a source/drain feature and/or an interface between a channel region and a gate dielectric layer. More specifically, the disclosure provides an improved In-based semiconductor surface, such as reducing a density of $D_{it}$, reducing a Schottky barrier height, suppressing formation of native oxide layer, etc., by forming an indium-sulfide passivation layer. As such, characteristic(s) of the semiconductor features passivated by the indium-sulfide layer may thus be advantageously improved.

The present disclosure provides a method in accordance with some embodiments. The method includes providing a semiconductor surface, forming an oxide layer over the semiconductor surface by performing wet chemical oxidation operations on the semiconductor surface with a first aqueous solution, and forming a sulfide layer over the semiconductor surface by performing sulfurization operations on the formed oxide layer with a second aqueous solution.

The present disclosure provides a semiconductor structure in accordance with some embodiments. The semiconductor structure includes a semiconductor feature, a passivation layer that includes indium sulfide formed over a surface of the semiconductor feature. More particularly, the surface of the semiconductor feature comprises indium-based III-V compound semiconductor material.

The present disclosure provides a method in accordance with some embodiments. The method includes providing an indium-based semiconductor surface, forming an oxide layer over the semiconductor surface by performing wet chemical oxidation operations on the indium-based semiconductor surface with a first solution, and forming an indium-sulfide layer over the semiconductor surface by performing sulfurization operations on the formed oxide layer with a second solution.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
  providing a semiconductor surface;
  forming an oxide layer over the semiconductor surface by performing wet chemical oxidation operations on the semiconductor surface with a first aqueous solution, wherein the first aqueous solution comprises ammonia-peroxide (APM); and
  forming a sulfide layer over the semiconductor surface by performing sulfurization operations on the formed oxide layer with a second aqueous solution, wherein the second aqueous solution comprises ammonium sulfide (($NH_4)_2S$), wherein the sulfide layer comprises indium sulfide and includes at least three monolayers of indium sulfide in thickness.

2. The method of claim 1, further comprising before forming the oxide layer, removing a native oxide layer over the semiconductor surface.

3. The method of claim 1, further comprising after forming the sulfide layer, forming a gate dielectric layer over the sulfide layer thereby to form a gate stack.

4. The method of claim 1, further comprising after forming the sulfide layer, forming a conductive layer that includes Ti/TiN over the sulfide layer thereby to form a source/drain feature.

5. The method of claim 1, wherein the semiconductor surface comprises indium-contained III-V semiconductor material.

6. The method of claim 1, wherein the thickness of the sulfide layer is determined based on an initial thickness of the oxide layer, reaction temperature and time of the sulfurization operation, concentration of the APM in the first aqueous solution, and/or concentration of the ($NH_4)_2S$ in the second aqueous solution.

7. The method of claim 1, further comprising forming a semiconductor layer over a substrate, and
  wherein providing the semiconductor surface includes forming an indium-based semiconductor surface over the semiconductor layer, the indium-based semiconductor surface being formed of a different material than the semiconductor material layer.

8. A method comprising:
  forming a semiconductor layer over a substrate;
  forming an indium-based semiconductor surface over the first semiconductor layer, the indium-based semiconductor surface being formed of a different material than the semiconductor material layer;
  forming an oxide layer over the indium-based semiconductor surface and the semiconductor layer by performing wet chemical oxidation operations on the indium-based semiconductor surface and the semiconductor layer with a first solution; and
  forming an indium-sulfide layer over the indium-based semiconductor surface and the semiconductor layer by performing sulfurization operations on the formed oxide layer with a second solution, wherein the indium-sulfide layer physically contacts the indium-based semiconductor surface and the semiconductor layer.

9. The method of claim 8 further comprising, after forming the indium-sulfide layer over the semiconductor surface, either forming a gate dielectric layer over the indium-sulfide layer thereby to form a gate stack or forming a conductive layer over the indium-sulfide layer thereby to form a source/drain feature.

10. The method of claim 8, wherein the first solution includes ammonia-peroxide (APM).

11. The method of claim 8, wherein the second solution includes ammonium sulfide (($NH_4)_2S$).

12. The method of claim 8, wherein the indium-sulfide layer is at least three monolayers in thickness.

13. The method of claim 8, further comprising forming a shallow trench isolation feature in the substrate, and
  wherein the semiconductor layer is embedded within the shallow isolation feature.

14. The method of claim 8, further comprising forming a gate dielectric layer directly on the indium-sulfide layer.

15. A method comprising:
  forming a fin structure disposed over a semiconductor substrate, the fin structure including a first semiconductor material layer and a second semiconductor material layer that is formed of a different semiconductor material than the first semiconductor material layer;
  forming an oxide layer directly on the first semiconductor material layer and the second semiconductor material layer by performing a wet chemical oxidation process on the first and second semiconductor material layers with a first aqueous solution; and
  forming a sulfide layer directly on the first and second semiconductor material layers by performing a sulfurization process on the oxide layer with a second aqueous solution, wherein after forming the sulfide layer directly on the first and second semiconductor material layers the sulfide layer physically contacts the first and second semiconductor material layers.

16. The method of claim 15, wherein the sulfide layer comprises indium sulfide and includes at least three monolayers of indium sulfide in thickness, wherein the first aqueous solution comprises ammonia-peroxide (APM), and wherein the second aqueous solution comprises ammonium sulfide $((NH_4)_2S)$.

17. The method of claim 15, wherein the first semiconductor layer includes indium and the second semiconductor layer is without indium.

18. The method of claim 17, wherein the semiconductor substrate include indium and the second semiconductor material layer is disposed between the semiconductor substrate and the first semiconductor material layer.

19. The method of claim 15, wherein the semiconductor substrate is formed of a third semiconductor material layer that is different than the first and second semiconductor material layer.

20. The method of claim 15, wherein performing the sulfurization process on the oxide layer with the second aqueous solution includes performing the sulfurization process on the oxide layer with the second aqueous solution at a pH range between 7 and 12.

* * * * *